(12) United States Patent
Park et al.

(10) Patent No.: US 7,733,103 B2
(45) Date of Patent: Jun. 8, 2010

(54) PROBE CARD

(75) Inventors: Ung-Gi Park, Seoul (KR); Je-Suck Park, Seoul (KR)

(73) Assignee: Mico TN Ltd., Anseong-Si (KR)

( * ) Notice: Subject to any disclaimer, the term of this patent is extended or adjusted under 35 U.S.C. 154(b) by 216 days.

(21) Appl. No.: 11/858,260

(22) Filed: Sep. 20, 2007

(65) Prior Publication Data

US 2008/0079452 A1 Apr. 3, 2008

(30) Foreign Application Priority Data

Sep. 29, 2006 (KR) .................. 10-2006-0095588

(51) Int. Cl.
*G01R 31/02* (2006.01)
(52) U.S. Cl. ..................................... 324/754
(58) Field of Classification Search ............... 324/754, 324/761–762, 765, 158.1; 257/48; 438/14–18
See application file for complete search history.

(56) References Cited

U.S. PATENT DOCUMENTS

| | | | | |
|---|---|---|---|---|
| 6,359,452 B1 * | 3/2002 | Mozzetta | ..................... | 324/754 |
| 6,509,751 B1 * | 1/2003 | Mathieu et al. | .............. | 324/754 |
| 7,075,319 B2 * | 7/2006 | Mori | .......................... | 324/754 |
| 7,482,821 B2 * | 1/2009 | Ishikawa et al. | ............ | 324/754 |

* cited by examiner

*Primary Examiner*—Ha Tran T Nguyen
*Assistant Examiner*—Tung X Nguyen
(74) *Attorney, Agent, or Firm*—Daly, Crowley, Mofford & Durkee, LLP

(57) ABSTRACT

A probe card includes a probe, a circuit board, a first reinforcing plate and a second reinforcing plate. The probe makes contact with an object. The circuit board is electrically connected to the probe. The first reinforcing plate has a first tap and a second tap for providing an adjustable gap between the first reinforcing plate and an upper surface of the circuit board. The second reinforcing plate is positioned under a lower surface of the circuit board. The second reinforcing plate combined with the second tap to form an adjustable gap between the second reinforcing plate and a lower surface of the circuit board.

8 Claims, 2 Drawing Sheets

PROBE CARD

CROSS-REFERENCE TO RELATED APPLICATIONS

This application claims priority under 35 USC §119 to Korean Patent Application No. 2006-95588, filed on Sep. 29, 2006 in the Korean Intellectual Property Office (KIPO), the contents of which are herein incorporated by reference in their entirety.

BACKGROUND OF THE INVENTION

1. Field of the Invention

Example embodiments of the present invention relate to a probe card. More particularly, example embodiments of the present invention relate to a probe card for inspecting a semiconductor substrate.

2. Description of the Related Art

Nowadays, integrated circuit devices are widely used to satisfy consumer demand. Manufacturing technologies have been developed to improve an integration degree, a reliability, a response speed, etc.

Generally, a semiconductor device is formed through a fab process for forming a layer on a semiconductor substrate and for forming a pattern having electrical characteristics by patterning the layer, a probe test process for electrically testing dies having the pattern, a cutting process for cutting the semiconductor substrate into the dies, and a packaging process for packaging the dies.

The probe test process, i.e., an electrical die sorting (EDS) process, is performed after the fab process, but prior to the assembly process in order to inspect electrical properties of the dies formed on the substrate.

The probe test process inspects whether the dies formed on the substrate are electrically 'good' or 'defective.' The 'defective' dies are detected by the probe test process at an early stage and regenerated using a repair process, thereby reducing the costs of the packaging process.

For example, conventional probe test processes are disclosed in Japanese Patent Laid-Open Publication Nos. 1994-120316, 1994-181248 and 1998-150082, and U.S. Pat. No. 5,254,939 issued to Anderson et al., U.S. Pat. No. 5,506,498 issued to Anderson et al., and U.S. Pat. No. 5,866,024 issued to de Villeneuve.

In the probe test process, the electrical properties of the die formed on the substrate are inspected using a probe station including a probe card and a performance board.

The probe card installed in the probe station includes a probe, a circuit board having a circuit electrically connected to the probe, and a reinforcing plate for reinforcing the circuit board to prevent thermal deformation or deflection of the circuit board. However, since a contact area between the circuit board and the reinforcing plate is considerably large, a large amount of heat in a test atmosphere may be transferred between the circuit and the reinforcing plate. Accordingly, the circuit board may be greatly deflected so that the reinforcing plate is deformed by the deflection of the circuit board. The deformed reinforcing plate may cause misalignment of the probe. Therefore, a contact failure between the probe and an object may occur due to the misalignment of the probe.

SUMMARY OF THE INVENTION

Example embodiments of the present invention provide a probe card having excellent thermal deformation-resistant characteristics by minimizing a contact area between a circuit board and a reinforcing plate.

According to one aspect of the invention, there is a probe card that includes a probe, a circuit board, a first reinforcing plate and a second reinforcing plate. The probe makes contact with an object. The circuit board is electrically connected to the probe. The first reinforcing plate has a first tap and a second tap for providing an adjustable gap between the first reinforcing plate and an upper surface of the circuit board. The second reinforcing plate is positioned under a lower surface of the circuit board. The second reinforcing plate combined with the second tap to form an adjustable gap between the second reinforcing plate and a lower surface of the circuit board.

In example embodiments of the present invention, the probe card may include a spacing member combined with the second tap.

In example embodiments of the present invention, a thickness of the spacing member may be greater than a thickness of the circuit board.

In example embodiments of the present invention, the spacing member may be integrally formed with the first reinforcing plate or the second reinforcing plate.

In example embodiments of the present invention, a spiral screw groove may be formed in the first and second taps. A through-hole may be formed in the spacing member such that the first reinforcing plate and the second reinforcing plate are integrally combined with together by a bolt that is inserted into the through-hole.

In example embodiments of the present invention, the first tap may be formed at an edge portion of the first reinforcing plate and the second tap may be formed in a central portion of the first reinforcing plate.

In example embodiments of the present invention, the probe may be positioned in the second reinforcing plate.

According to example embodiments of the present invention, a contact area between a circuit board and first and second reinforcing plates may be minimized, thereby reducing high heat transfer in a test environment and enhancing the alignment of the probe despite deflection of the circuit board due to thermal deformation.

BRIEF DESCRIPTION OF THE DRAWINGS

The above and other features and advantages of the present invention will become more apparent by describing in detailed example embodiments thereof with reference to the accompanying drawings, in which.

DESCRIPTION OF THE EMBODIMENTS

Figure 1:
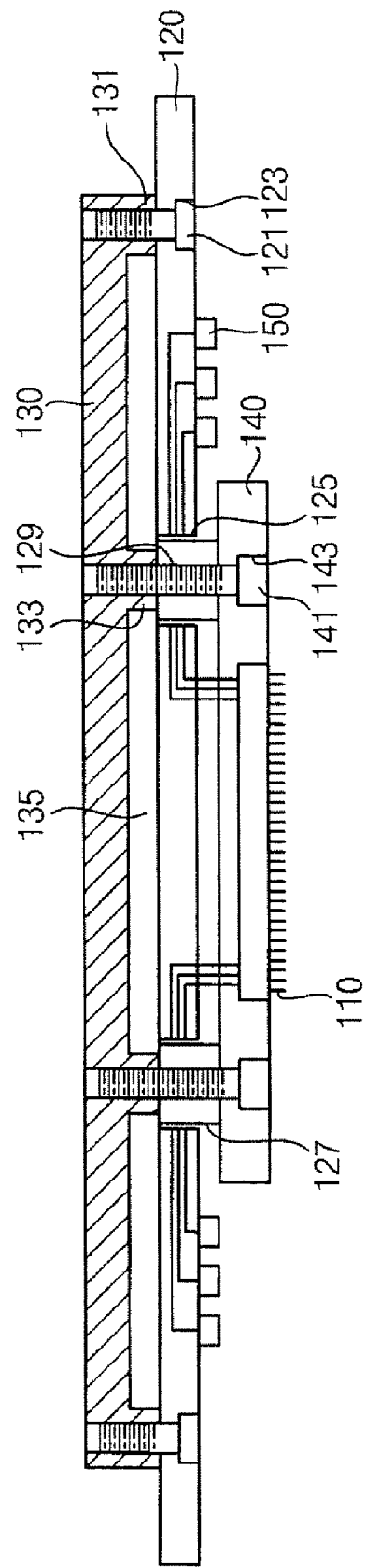
FIG. 1 is a cross-sectional view illustrating a probe card in accordance with example embodiments of the present invention.

The present invention is described more fully hereinafter with reference to the accompanying drawings, in which example embodiments of the present invention are shown. The present invention may, however, be embodied in many different forms and should not be construed as limited to the example embodiments set forth herein. Rather, these example embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like reference numerals refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments of the present invention are described herein with reference to cross-section illustrations that are schematic illustrations of idealized embodiments (and intermediate structures) of the present invention. As such, variations from the shapes of the illustrations as a result, for example, of manufacturing techniques and/or tolerances, are to be expected. Thus, example embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments of the present invention will be explained in detail with reference to the accompanying drawings.

Figure 2:
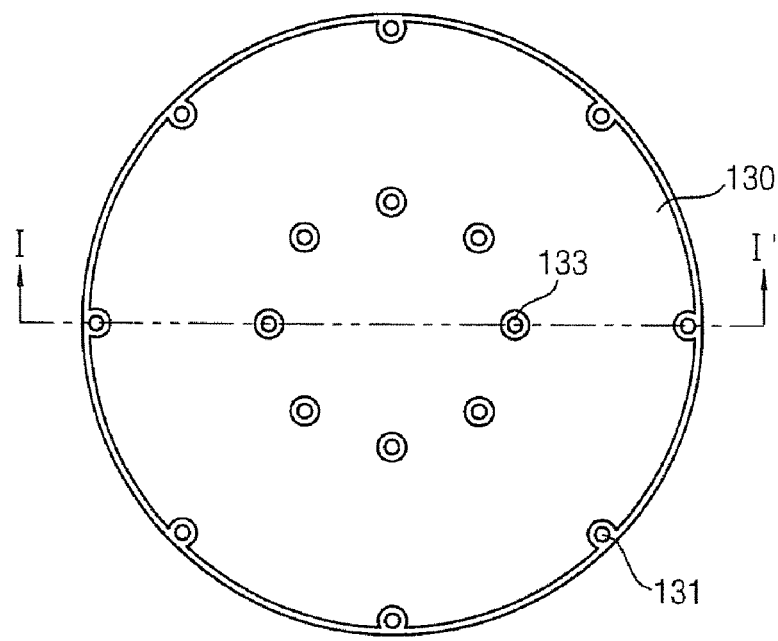
FIG. 2 is a plan view illustrating a first reinforcing plate of the probe card in FIG. 1.
Figure 3:
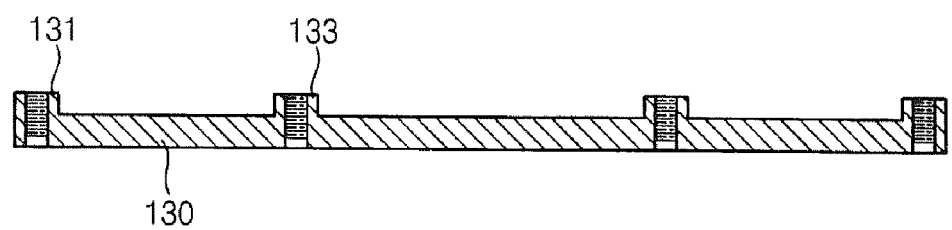
FIG. 3 is a cross-sectional view illustrating the first reinforcing plate of the probe card in FIG. 2.

FIG. 1 is a cross-sectional view illustrating a probe card in accordance with example embodiments of the present invention. FIG. 2 is a plan view illustrating a first reinforcing plate of the probe card in FIG. 1. FIG. 3 is a cross-sectional view illustrating the first reinforcing plate of the probe card in FIG. 2.

Referring to FIGS. 1 to 3, a probe card 100 includes a probe 110, a circuit board 120, a first reinforcing plate 130 and a second reinforcing plate 140. The probe makes contact with an object. The circuit board 120 is electrically connected to the probe 110. The first reinforcing plate 130 is positioned over an upper surface of the circuit board 120. The second reinforcing plate 140 is positioned under a lower surface of the circuit board 120.

Taps are formed on a surface of the first reinforcing plate 130. The taps have a predetermined height from the surface of the first reinforcing plate 130. The taps may include a first tap 131 and a second tap 133. The first tap 131 having the predetermined height may be formed at an edge portion of the first reinforcing plate 130. The second tap 133 having the predetermined height may be formed at a central portion of the first reinforcing plate 130.

A spiral screw groove may be formed on inner circumferential surfaces of the first tap 131 and the second tap 133. The first and second taps 131 and 133 protrude from the surface of the first reinforcing plate 130. Accordingly, a face of the first reinforcing plate 130 except for the portions where the first and second taps 131 and 133 are formed is lower than those of the taps 131 and 133.

A first through-hole 123 is formed in the circuit board 120 corresponding to the first taps 131. A first bolt 121 is inserted into the first through-hole 123. The first bolt 121 is fastened with the spiral screw groove on the inner circumferential surface of the first tap 131. The first reinforcing plate 130 is combined with the circuit board 120 by fastening the first bolt 121 with the spiral screw groove formed in the first tap 131.

Because the first and second taps 131 and 133 have the predetermined height from the circuit board 120, only the first and second taps 131 and 133 make contact with the circuit board 120, whereas the portion of the first reinforcing plate 130 except for the first and second taps 131 and 133 is spaced apart by a gap 135 from the circuit board 120. Thus, an adjustable gap is formed between the first reinforcing plate 130 and the circuit board 120.

An inserting hole 125 is formed in the circuit board 120 corresponding to the second tap 133. A second through-hole 143 is formed in the second reinforcing plate 140 corresponding to the second tap 133. A second bolt 141 is inserted into the second through-hole 143 and the inserting hole 125. The second bolt 141 is fastened with the spiral screw groove on the inner circumferential surface of the second tap 133. The second reinforcing plate 140 is combined with the first reinforcing plate 130 by fastening the second bolt 141 with the spiral screw groove formed in the second tap 133. Additionally, the second reinforcing plate 140 is spaced apart from a lower surface of the circuit board 120 by controllably fastening the second bolt 141 with the second tap 133.

In example embodiments of the present invention, a spacing member 127 may be inserted into the inserting hole 125. The spacing member 127 has a thickness greater than a thickness of the circuit board 120. The spacing member 127 may include a bushing. For example, the bushing may include carbon steel.

The second reinforcing plate 140 is spaced apart from the second tap 133 of the first plate by the thickness of the spacing member 127. Further, the second reinforcing plate 140 is spaced apart from the lower surface of the circuit board 120 by a thickness difference between the spacing member 127 and the circuit board 120. Further, the spacing member 127 may suppress deformation of the circuit board 120 caused by heat from the probe card.

The spacing member 127 is inserted into the inserting hole 125. The spacing member 127 is arranged between the first reinforcing plate 130 and the second reinforcing plate 140. A third through-hole 129 is formed in the spacing member 127. The second bolt 141 is inserted into the third through-hole 129 and is fastened with the spiral screw groove formed in the first reinforcing member 130.

The second through-hole 143 is formed in the second reinforcing plate 140 corresponding to the second tap 133. The second bolt 141 is inserted into the second through-hole 143. The second reinforcing plate 140 is combined with the first reinforcing plate 130 by fastening the second bolt 141 with the spiral screw groove formed in the second tap 133. In addition, the second reinforcing plate 140 positioned under the circuit board does not make contact with the circuit board 120 due to the spacing member. The second reinforcing plate 140 is spaced apart from the circuit board by a predetermined distance.

Since the second reinforcing plate 140 is spaced apart from the circuit board, heat transfer into the circuit board 120 may be decreased. Although the circuit board 120 is deformed by the heat transfer, the second reinforcing plate 140 may not be affected by the deformation of the circuit board 120.

In another example embodiment of the present invention, the spacing member 127 may be integrally formed with the first reinforcing member 130. In particular, the spacing member 127 may be integrally formed with the second tap 133 of the first reinforcing member 130. The spacing member 127 formed with the second tap 133 is inserted into the inserting hole 125 and is combined with the second reinforcing plate 140.

In still another example embodiment of the present invention, the spacing member 127 may be integrally formed with the second reinforcing member 140. In particular, the spacing member 127 may be integrally formed with the second reinforcing member 140 corresponding to the second tap 133. The spacing member 127 that is formed with the second reinforcing plate 140 is inserted into the inserting hole 125 and is combined with the first reinforcing plate 130.

The probe 110 is positioned in the second reinforcing plate 140. For example, the probe 100 may correspond to a plurality of electrodes (not illustrated) of at least one device that is formed on a wafer.

The probe 110 is electrically connected to a plurality of terminal electrodes 150 of the circuit board 120. The probe 110 may be formed using a micro-electromechanical systems (MEMS) technology.

According to example embodiments of the present invention, a contact area between a circuit board and first and second reinforcing plates may be minimized, thereby reducing high heat transfer in a test environment and enhancing the alignment of the probe despite deflection of the circuit board due to thermal deformation.

The foregoing is illustrative of the present invention and is not to be construed as limiting thereof. Although a few example embodiments of the present invention have been described, those skilled in the art will readily appreciate that many modifications are possible in the example embodiments without materially departing from the novel teachings and advantages of the present invention. Accordingly, all such modifications are intended to be included within the scope of the present invention as defined in the claims. In the claims, means-plus-function clauses are intended to cover the structures described herein as performing the recited function and not only structural equivalents but also equivalent structures. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The present invention is defined by the following claims, with equivalents of the claims to be included therein.

What is claimed is:

1. A probe card comprising:
a probe making contact with an object;
a circuit board electrically connected to the probe;
a first reinforcing plate having a first tap and a second tap for providing an adjustable gap between the first reinforcing plate and an upper surface of the circuit board;
a second reinforcing plate positioned under a lower surface of the circuit board and combined with the second tap to have an adjustable gap between the second reinforcing plate and the lower surface of the circuit board; and
a spacing member combined with the second tap,
wherein the circuit board has an inserting hole at a position corresponding to the second tap and the spacing member is positioned in the inserting hole,
wherein the first tap is formed at an edge portion of the first reinforcing plate and the second tap is formed at a central portion of the first reinforcing plate.

2. The probe card of claim 1, wherein a thickness of the spacing member is greater than a thickness of the circuit board.

3. The probe card of claim 1, wherein the spacing member is integrally formed with the first reinforcing plate or the second reinforcing plate.

4. The probe card of claim 1, wherein a spiral screw groove is formed in the first and the second taps and a through-hole is formed in the spacing member such that the first reinforcing plate and the second reinforcing plate are integrally combined with together by a bolt inserted in the through-hole.

5. The method of claim 1, wherein the probe is positioned at the second reinforcing plate.

6. A probe card comprising:
a probe making contact with an object;
a circuit board electrically connected to the probe;
a first reinforcing plate having a first tap at a peripheral portion of the first reinforcing plate and a second tap at a central portion of the first reinforcing plate for providing an adjustable gap between the first reinforcing plate and an upper surface of the circuit board;
a second reinforcing plate positioned under a lower surface of the circuit board and combined with the second tap to have an adjustable gap between the second reinforcing plate and the lower surface of the circuit board; and
a spacing member combined with the second tap.

7. The probe card of claim 6, wherein the circuit board has an inserting hole at a position corresponding to the second tap and the spacing member is positioned in the inserting hole.

8. The probe card of claim 7, wherein a thickness of the spacing member is greater than a thickness of the circuit board.

* * * * *